(12) United States Patent
Jin et al.

(10) Patent No.: US 9,154,087 B2
(45) Date of Patent: Oct. 6, 2015

(54) AMPLIFIERS WITH CONFIGURABLE MUTUALLY-COUPLED SOURCE DEGENERATION INDUCTORS

(71) Applicant: QUALCOMM Incorporated, San Diego, CA (US)

(72) Inventors: Zhang Jin, San Diego, CA (US); Ahmed A. Youssef, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 93 days.

(21) Appl. No.: 13/956,626

(22) Filed: Aug. 1, 2013

(65) Prior Publication Data

US 2015/0035600 A1    Feb. 5, 2015

(51) Int. Cl.
*H03F 1/56* (2006.01)
*H03F 3/193* (2006.01)
*H03F 1/22* (2006.01)
*H03F 3/68* (2006.01)

(52) U.S. Cl.
CPC ............... *H03F 1/565* (2013.01); *H03F 1/223* (2013.01); *H03F 3/193* (2013.01); *H03F 3/68* (2013.01)

(58) Field of Classification Search
USPC .......................... 330/277, 311, 296, 283, 305
See application file for complete search history.

(56) References Cited

U.S. PATENT DOCUMENTS

| 8,008,973 | B2 * | 8/2011 | Fujimoto ...................... 330/283 |
| 8,102,213 | B2 | 1/2012 | Tasic et al. |
| 8,432,217 | B2 | 4/2013 | Riekki et al. |
| 2008/0029753 | A1 | 2/2008 | Xu et al. |
| 2009/0258624 | A1 | 10/2009 | Gudem et al. |
| 2011/0018635 | A1 | 1/2011 | Tasic et al. |
| 2013/0043946 | A1 | 2/2013 | Hadjichristos et al. |

FOREIGN PATENT DOCUMENTS

| EP | 2456068 A1 | 5/2012 |
| WO | 2008146256 A2 | 12/2008 |
| WO | 2012156946 A1 | 11/2012 |

OTHER PUBLICATIONS

Aparin V., et al., "A Highly-integrated Tri-band/quad-mode SiGe BiCMOS RF-to-baseband Receiver for Wireless CDMA/WCDMA/ AMPS Applications with GPS Capability", Solid-State Circuits Conference, 2002, Digest of Technical Papers, 200 2 IEEE International Feb. 3-7, 2002, Piscataway, NJ, USA,IEEE, DOI: 10.1109/ISSCC. 2002.993022, ISBN: 978-0-7803-7335-8, vol. 1, XP032407452, Feb. 7, 2002, pp. 234-235.
International Search Report and Written Opinion—PCT/US2014/ 048764—ISA/EPO—Nov. 19, 2014.

* cited by examiner

*Primary Examiner* — Hieu Nguyen
(74) *Attorney, Agent, or Firm* — Smith Risley Tempel Santos LLC

(57) ABSTRACT

Amplifiers with configurable mutually-coupled source degeneration inductors are disclosed. In an exemplary design, an apparatus (e.g., a wireless device or an integrated circuit) includes a gain transistor and a plurality of inductors, which may implement an amplifier. The gain transistor receives an input signal and provides an amplified signal. The plurality of inductors are mutually coupled, are coupled to the gain transistor, and provide a programmable source degeneration inductance for the gain transistor. The inductors may have a positive coupling coefficient and may provide a larger source degeneration inductance. Alternatively, the inductors may have a negative coupling coefficient and may provide a smaller source degeneration inductance.

15 Claims, 12 Drawing Sheets

_US 9,154,087 B2_

AMPLIFIERS WITH CONFIGURABLE MUTUALLY-COUPLED SOURCE DEGENERATION INDUCTORS

BACKGROUND

I. Field

The present disclosure relates generally to electronics, and more specifically to amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a local oscillator (LO) signal with data to obtain a modulated signal, amplify the modulated signal to obtain an output radio frequency (RF) signal having the proper transmit power level, and transmit the output RF signal via an antenna to a base station. For data reception, the receiver may obtain a received RF signal via the antenna and may amplify and process the received RF signal to recover data sent by the base station.

A wireless device may include amplifiers of different types for different purposes. For example, a wireless device may include a low noise amplifier (LNA) in a receiver, a power amplifier (PA) in a transmitter, and a variable gain amplifier (VGA) in the receiver and/or transmitter. An amplifier may need to meet various requirements related to gain, linearity, etc.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Amplifiers with configurable mutually-coupled source degeneration inductors are disclosed herein. Such an amplifier includes multiple mutually-coupled inductors that may be configured to obtain different source degeneration inductances for the amplifier. A configurable source degeneration inductance may improve the performance of the amplifier and provide other advantages. Amplifiers with configurable mutually-coupled source degeneration inductors may be used for various electronic devices such as wireless communication devices.

Figure 1:
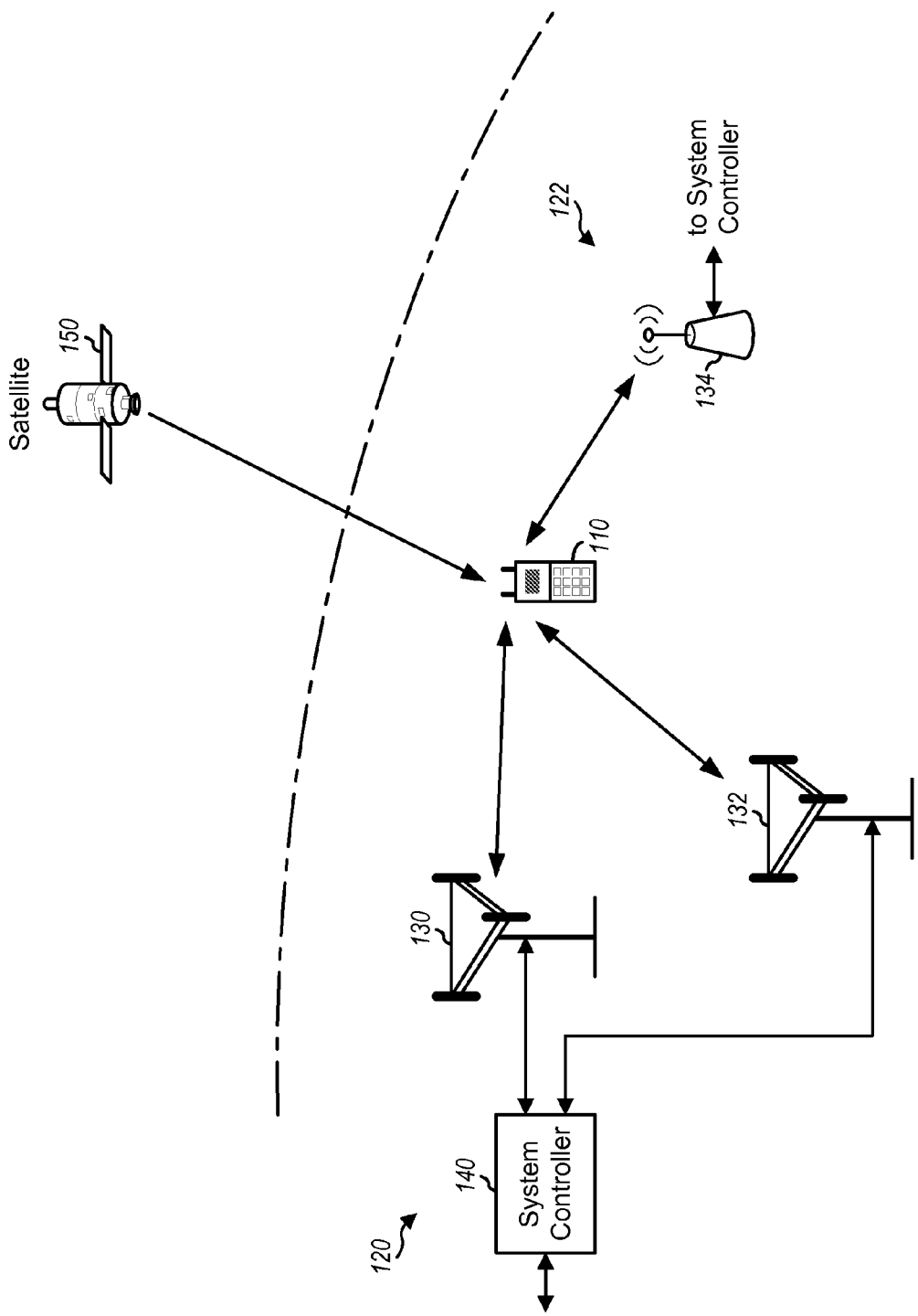
FIG. 1 shows a wireless device communicating with wireless systems.

FIG. 1 shows a wireless device 110 communicating with wireless communication systems 120 and 122. Each wireless system may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous CDMA (TD-SCDMA), or some other version of CDMA. For simplicity, FIG. 1 shows wireless system 120 including two base stations 130 and 132 and one system controller 140, and wireless system 122 including one base station 134. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120 and/or 122. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1X, TD-SCDMA, GSM, 802.11, etc.

Figure 2:
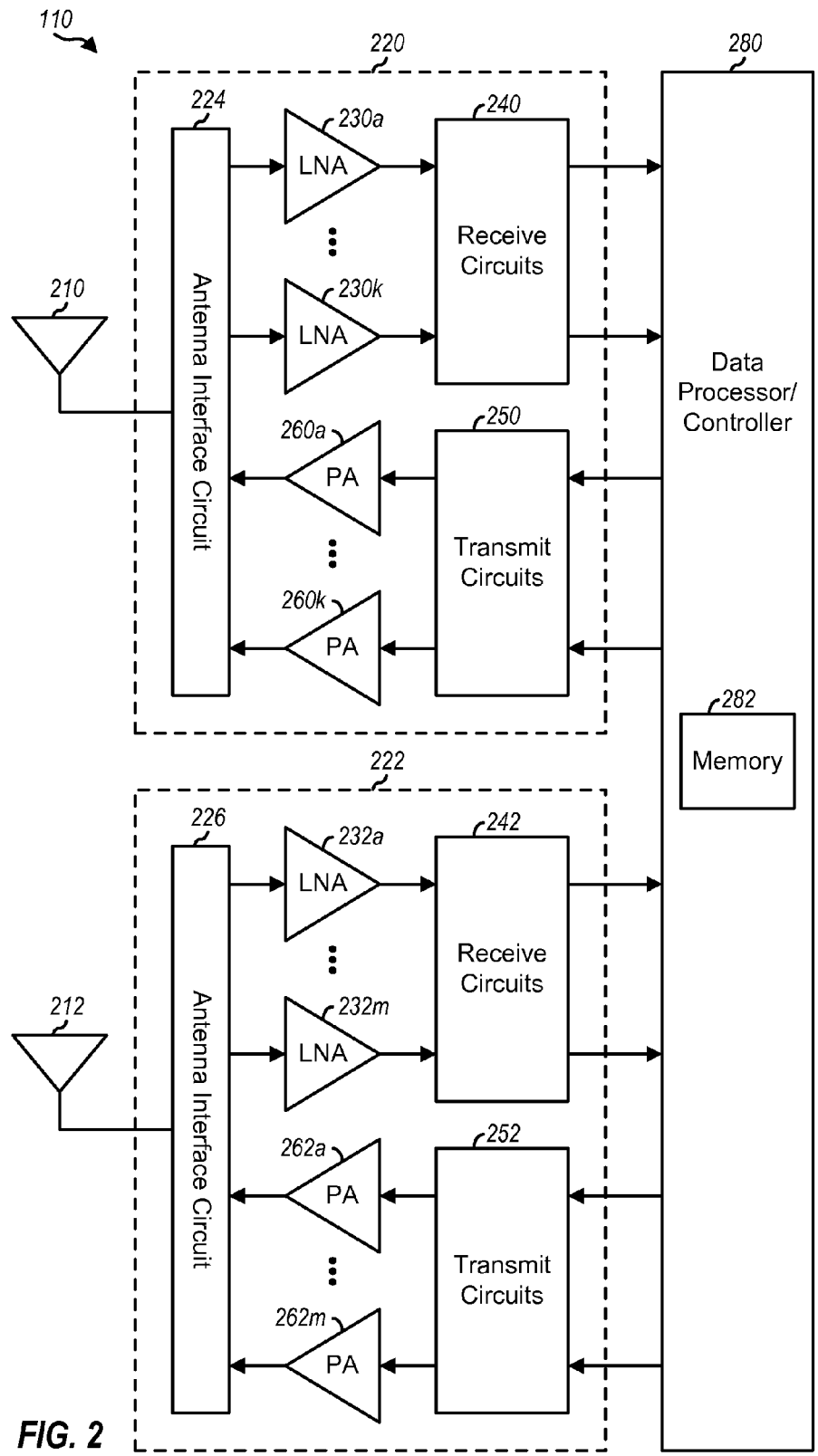
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes an antenna interface circuit 224, K LNAs 230a to 230k, receive circuits 240, transmit circuits 250, and K power amplifiers (PAs) 260a to 260k, where K may be any integer value. Transceiver 222 includes an antenna interface circuit 226, M LNAs 232a to 232m, receive circuits 242, transmit circuits 252, and M PAs 262a to 262m, where M may be any integer value. Transceivers 220 and 222 may support multiple frequency bands, carrier aggregation, multiple radio technologies, multiple wireless systems, receive diversity, transmit diversity, multiple-input multiple-output (MIMO) transmission from multiple transmit antennas to multiple receive antennas, etc., or any combination thereof.

For data reception, antenna 210 receives signals from base stations and/or other transmitter stations and provides a received RF signal to antenna interface circuit 224. Antenna interface circuit 224 provides one or more input RF signals to one or more selected LNAs 230. Antenna interface circuit 224 may include switches, duplexers, diplexers, transmit filters, receive filters, matching circuits, directional couplers, etc. Each selected LNA 230 amplifies its input RF signal and provides one or more amplified RF signals to receive circuits 240. Receive circuits 240 downconvert each amplified RF signal from RF to baseband, filter and amplify the downconverted signal, and provide an input baseband signal to data processor 280. Receive circuits 240 may include mixers, filters, amplifiers, matching circuits, oscillators, LO generators, phase locked loops (PLLs), etc.

For data transmission, data processor 280 processes (e.g., encodes and modulates) data to be transmitted and provides one or more output baseband signals to transmit circuits 250. Transmit circuits 250 amplify, filter, and upconvert each output baseband signal from baseband to RF and provide a resultant modulated signal to a selected PA 260. Transmit circuits 250 may include amplifiers, filters, mixers, matching circuits, oscillators, LO generators, PLLs, etc. Each selected PA 260 amplifies its modulated signal and provides an output RF signal having the proper transmit power level. The output RF signal from each selected PA 260 is routed through antenna interface circuit 224 and transmitted via antenna 210.

LNAs 232, receive circuits 242, transmit circuits 252, and PAs 262 within transceiver 222 may operate in similar manner as LNAs 230, receive circuits 240, transmit circuits 250, and PAs 260 within transceiver 220. Transceivers 220 and 222 may include other circuits not shown in FIG. 2. All or a portion of transceivers 220 and 222 may be implemented on one or more analog integrated circuits (ICs), RF ICs (RFICs), mixed-signal ICs, etc. For example, LNAs 230 and receive circuits 240 may be implemented on one module, which may be an RFIC, etc. The circuits in transceivers 220 and 222 may also be implemented in other manners.

Data processor/controller 280 may perform various functions for wireless device 110. For example, data processor 280 may perform processing for data being received via receiver circuits 240 and 242 and data being transmitted via transmit circuits 250 and 252. Controller 280 may control the operation of various circuits within transceivers 220 and 222. A memory 282 may store program codes and data for data processor/controller 280. Data processor/controller 280 may be implemented on one or more application specific integrated circuits (ASICs) and/or other ICs.

FIG. 2 shows an exemplary design of wireless device 110 with two transceivers 220 and 222 coupled to two antennas 210 and 212. In general, a wireless device may include any number of transceivers for any number of antennas. Each transceiver may include any number of LNAs and any number of PAs to support any number of frequency bands, any number of carriers for carrier aggregation, any number of wireless systems, any number of radio technologies, etc.

LNAs 230 and 232 in FIG. 2 may be implemented with various circuit designs and with transistors of various types. Some exemplary circuit designs of LNAs implemented with N-channel metal oxide semiconductor (NMOS) transistors are described below.

Figure 3:
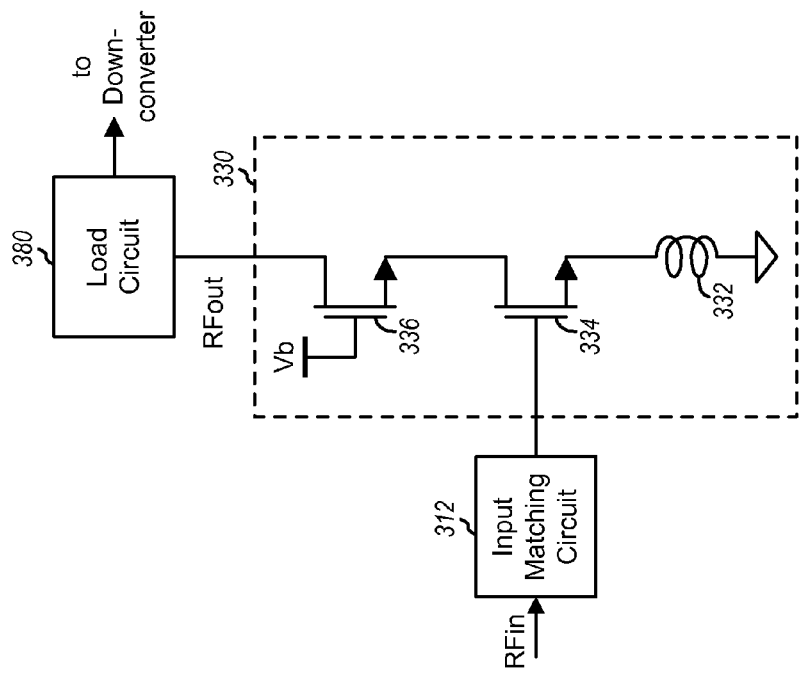
FIG. 3 shows an LNA with a fixed source degeneration inductor.

FIG. 3 shows a schematic diagram of an LNA 330 with a fixed source degeneration inductor. LNA 330 includes a source degeneration inductor 332, a gain transistor 334, and a cascode transistor 336. An input matching circuit 312 has one end receiving an input RF signal (RFin) and the other end coupled to the gate of gain transistor 334. Gain transistor 334 has its source coupled to one end of inductor 332 and its drain coupled to the source of cascode transistor 336. The other end of inductor 332 is coupled to circuit ground. Cascode transistor 336 has its gate receiving a control signal (Vb) and its drain coupled to a load circuit 380. Gain transistor 334 and cascode transistor 336 may be implemented with NMOS transistors, as shown in FIG. 3, or with transistors of other types.

Within LNA 330, gain transistor 334 amplifies the RFin signal and provides an amplified signal. Cascode transistor 336 buffers the amplified signal and provides an output RF signal (RFout) to load circuit 380. Source degeneration inductor 332 performs several functions. First, inductor 332 enables LNA 330 to obtain good dynamic range (e.g., low noise figure) and achieve high sensitivity for a receiver with low power consumption. Second, inductor 332 helps with input matching of LNA 330.

An LNA may include a fixed source degeneration inductor having an inductance that is selected to obtain good performance, e.g., high dynamic range, good linearity, and good input matching. The LNA may have a configurable gain and/or other configurable characteristics. A fixed source degeneration inductor may be unable to provide good performance for different possible settings of the LNA.

In an aspect of the present disclosure, an amplifier includes a programmable source degeneration inductor that is implemented with multiple mutually-coupled inductors. The mutually-coupled inductors may be configured to obtain different source degeneration inductances for the amplifier. The amplifier may support multiple operating modes. The amplifier may be configured with a suitable source degeneration inductance for each operating mode in order to obtain good performance for the amplifier.

Figure 4:
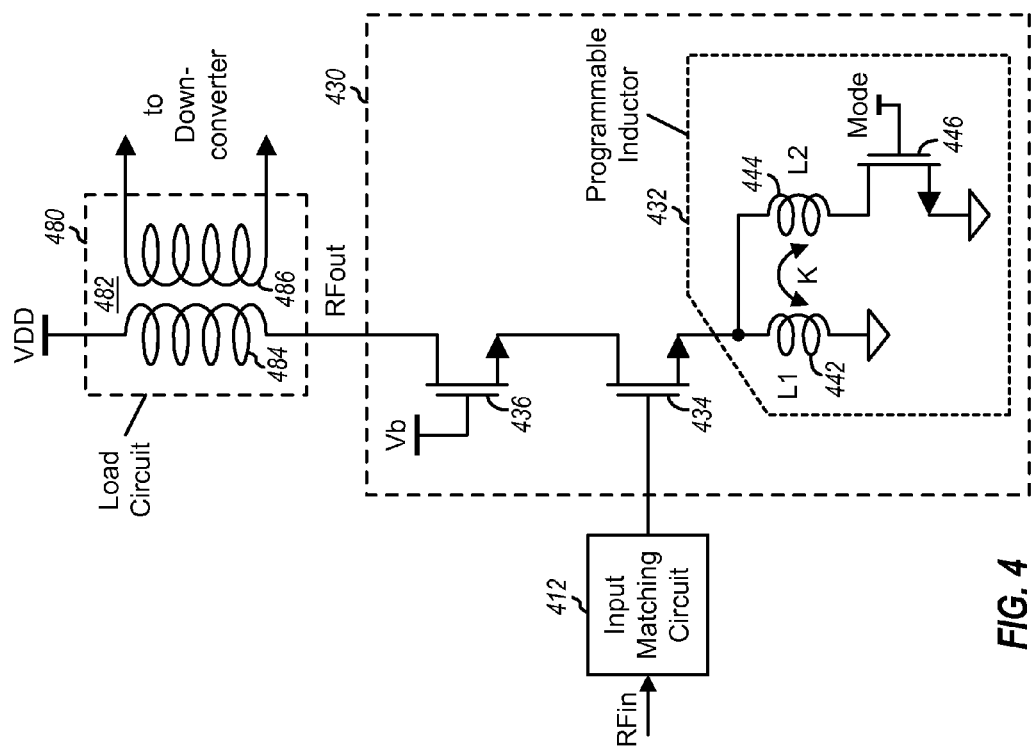
FIG. 4 shows an LNA with configurable mutually-coupled source degeneration inductors.

FIG. 4 shows a schematic diagram of an exemplary design of an LNA 430 with configurable mutually-coupled source degeneration inductors. LNA 430 may be used for any of LNAs 230 and 232 in FIG. 2. In the exemplary design shown in FIG. 4, LNA 430 includes a programmable inductor 432, a gain transistor 434, and a cascode transistor 436. An input matching circuit 412 has one end receiving an input RF signal (RFin) and the other end coupled to the gate of gain transistor 434. Input matching circuit 412 may comprise (i) an inductor coupled between the input and output of input matching circuit 412 and/or (ii) other circuit components. Gain transistor 434 has its source coupled to one end of inductor 432 and its drain coupled to the source of cascode transistor 436. Inductor 432 is further coupled to circuit ground. Cascode transistor 436 has its gate receiving a control signal (Vb) and its drain coupled to a load circuit 480. Gain transistor 434 and cascode transistor 436 may be implemented with NMOS transistors, as shown in FIG. 4, or with transistors of other types.

In the exemplary design shown in FIG. 4, load circuit 480 includes a transformer 482 comprising a primary coil 484 and a secondary coil 486. Primary coil 484 is coupled between the drain of cascode transistor 436 and a power supply (VDD). Secondary coil 486 provides a differential RF signal to a downconverter (not shown in FIG. 4). Load circuit 480 may also be implemented in other manners. In another exemplary design, a load circuit may include an inductor and possibly a capacitor coupled between the VDD supply and the drain of a cascode transistor. In yet another exemplary design, a load circuit may include a P-channel metal oxide semiconductor (PMOS) transistor having its source coupled to the VDD supply and its drain coupled to the drain of a cascode transistor (e.g., cascode transistor 436). The PMOS transistor may provide an active load for the cascode transistor.

In the exemplary design shown in FIG. 4, programmable inductor 432 includes two configurable mutually-coupled source degeneration inductors 442 and 444 coupled in parallel. Inductor 442 has one end coupled to the source of gain transistor 434 and the other end coupled to circuit ground. Inductor 444 has one end coupled to the source of gain transistor 434 and the other end coupled to the drain of a transistor 446. Transistor 446 has its source coupled to circuit ground and its gate receiving a mode control signal (Mode). Inductor 444 and transistor 446 are coupled in series, and the series combination is coupled in parallel with inductor 442. Transistor 446 operates as a switch that may be either (i) closed to couple inductor 444 in parallel with inductor 442 or (ii) opened to disconnect inductor 444 from the parallel combination with inductor 442. Inductor 442 has an inductance of L1, and inductor 444 has an inductance of L2.

LNA 430 may support multiple operating modes, which may be associated with different configurations of programmable inductor 432. In a first mode, transistor 446 is turned OFF, and only inductor 442 is coupled between the source of gain transistor 434 and circuit ground. In the first mode, the source degeneration inductance may be expressed as:

$$Loff = L1, \qquad \text{Eq (1)}$$

where Loff is the source degeneration inductance with transistor 446 turned OFF.

In a second mode, transistor 446 is turned ON, and both inductors 442 and 444 are coupled between the source of transistor 434 and circuit ground. Inductors 442 and 444 are mutually coupled. The amount of mutual coupling may be quantified by a coupling coefficient K. In the second mode, the source degeneration inductance may be expressed as:

$$Lon = \frac{(L1+M)*(L2+M)}{(L1+M)+(L2+M)}, \text{ and} \qquad \text{Eq (2)}$$

$$M = K * \sqrt{L1*L2}, \qquad \text{Eq (3)}$$

where Lon is the source degeneration inductance with transistor 446 turned ON, and M is a mutual inductance of inductors 442 and 444 due to mutual coupling.

The inductance of the parallel combination of inductors 442 and 444, without any mutual coupling, may be given as $$Lparallel = \frac{L1*L2}{L1+L2}.$$

As shown in equation (2), the Lon inductance is equal to the parallel combination of (i) the L1 inductance plus the mutual inductance M and (ii) the L2 inductance plus the mutual inductance M.

The coupling coefficient K may have a positive sign (K>0) or a negative sign (K<0). The sign of the coupling coefficient may be dependent on the orientation and/or layout of conductors used to implement inductors 442 and 444. For a positive coupling coefficient (K>0), the mutual coupling is greater than zero (M>0), and the Lon inductance is greater than the Lparallel inductance (Lon>Lparallel). Conversely, for a negative coupling coefficient (K<0), the mutual coupling is less than zero (M<0), and the Lon inductance is less than the Lparallel inductance (Lon<Lparallel). A positive coupling coefficient may be used to (i) increase the Lon inductance for a given L2 inductance or (ii) reduce the size of inductor 444 (or L2) for a desired Lon inductance. A negative coupling coefficient may be used to reduce the Lon inductance for a given L2 inductance.

Figure 5B:
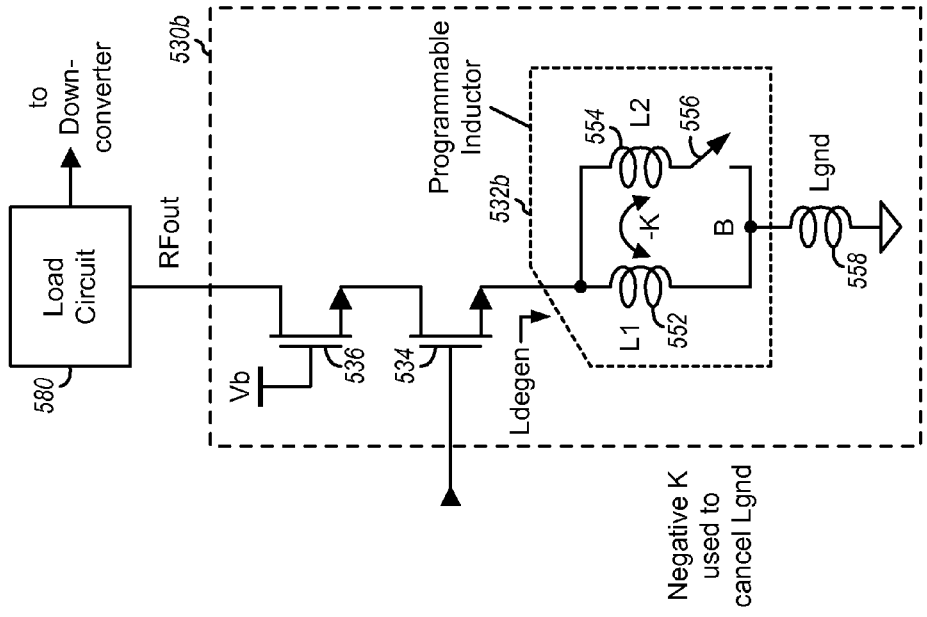
FIGS. 5A and 5B show amplifiers with mutually-coupled source degeneration inductors having positive and negative coupling coefficients, respectively.
Figure 5A:
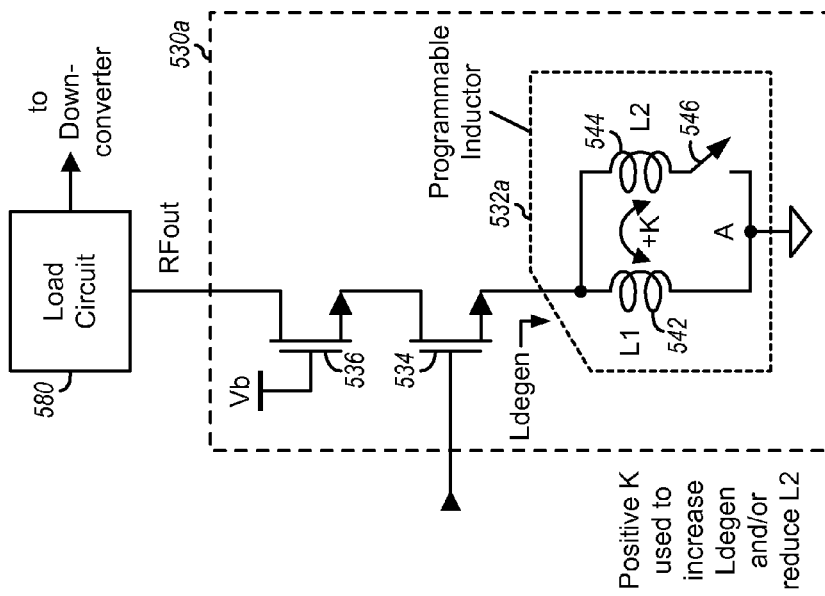

FIG. 5A shows an exemplary design of an amplifier 530a with mutually-coupled source degeneration inductors having a positive coupling coefficient. Amplifier 530a includes a gain transistor 534, a cascode transistor 536, and a programmable inductor 532a for source degeneration. In the exemplary design shown in FIG. 5A, programmable inductor 532a includes two configurable mutually-coupled inductors 542 and 544. Inductor 542 is coupled between the source of gain transistor 534 and node A. Inductor 544 is coupled in series with a switch 546, and the series combination is coupled between the source of gain transistor 534 and node A. Inductors 542 and 544 have a positive coupling coefficient (+K or K>0). FIG. 5A assumes a direct connection (e.g., negligible parasitic inductance) between node A and circuit ground.

Table 1 shows inductances for different possible positive coupling coefficients. Column 2 of Table 1 shows the L1 inductance of inductor 542, the L2 inductance of inductor 544, the mutual inductance M, the Lon and Loff inductances of inductor 532a, and the ratio of Loff to Lon for a first case with no mutual coupling (K=0) between inductors 542 and 544. Column 3 lists the L1, L2, M, Lon and Loff inductances and the Loff/Lon ratio for a second case with a positive coupling coefficient of 0.3 between inductors 542 and 544. Column 4 lists the L1, L2, M, Lon and Loff inductances and the Loff/Lon ratio for a third case with a positive coupling coefficient of 0.6 between inductors 542 and 544.

As shown in Table 1, the same Loff inductance of 1.5 nanoHenries (nH) and the same Lon inductance of 0.75 nH may be obtained for all three cases. However, the Lon inductance of 0.75 nH may be obtained with (i) a nominal L2 inductance of 1.5 nH for inductor 544 with no mutual coupling, or (ii) a smaller L2 inductance of 0.9 nH for inductor 544 with a coupling coefficient of 0.3, or (iii) an even smaller L2 inductance of 0.6 nH for inductor 544 with a coupling coefficient of 0.6. A positive coupling coefficient may thus be used to reduce the size of inductor 544 for a given Lon inductance.

TABLE 1

| | Positive Coupling Coefficient K | | |
|---|---|---|---|
| | K = 0 | K = 0.3 | K = 0.6 |
| L1 | 1.5 nH | 1.5 nH | 1.5 nH |
| L2 | 1.5 nH | 0.9 nH | 0.6 nH |
| M | 0 | 0.35 nH | 0.57 nH |
| Loff | 1.5 nH | 1.5 nH | 1.5 nH |
| Lon | 0.75 nH | 0.75 nH | 0.75 nH |
| Loff/Lon Ratio | 2:1 | 2:1 | 2:1 |

FIG. 5B shows an exemplary design of an amplifier 530b with mutually-coupled source degeneration inductors having a negative coupling coefficient. Amplifier 530b includes gain transistor 534, cascode transistor 536, and a programmable inductor 532b for source degeneration. In the exemplary design shown in FIG. 5B, programmable inductor 532b includes two configurable mutually-coupled inductors 552 and 554. Inductor 552 is coupled between the source of gain transistor 534 and node B. Inductor 554 is coupled in series with a switch 556, and the series combination is coupled between the source of gain transistor 534 and node B. Inductors 552 and 554 have a negative coupling coefficient (−K or K<0). A parasitic inductor 558 is coupled between node B and circuit ground. Inductor 558 may be due to a routing trace from the ends of inductors 552 and 554 to circuit ground. This routing trace may be relatively long and may result in a non-negligible inductance of Lgnd for inductor 558.

When switch 556 is opened, the source degeneration inductance may be expressed as:

$$L\text{degen\_off} = L\text{off} + L\text{gnd} = L1 + L\text{gnd}. \quad \text{Eq (4)}$$

As shown in equation (4), parasitic inductor 558 effectively increases the source degeneration inductance.

When switch 556 is closed, the source degeneration inductance may be expressed as:

$$L\text{degen\_on} = L\text{on} + L\text{gnd} = \frac{(L1+M)*(L2+M)}{(L1+M)+(L2+M)} + L\text{gnd}. \quad \text{Eq (5)}$$

The mutual inductance M in equation (5) may be determined as shown in equation (3).

Table 2 shows inductances for different possible negative coupling coefficients. Column 2 of Table 2 shows the L1 inductance of inductor 552, the L2 inductance of inductor 554, the Lgnd inductance of inductor 558, the mutual inductance M, the Lon and Loff inductances, and the Ldegen_on and Ldegen_off inductances for a first case with no mutual coupling (K=0) between inductors 552 and 554. Column 3 lists the L1, L2, Lgnd, M, Lon, Loff, Ldegen_on and Ldegen_off inductances for a second case with a negative coupling coefficient of −0.3 between inductors 552 and 554. Column 4 lists the L1, L2, Lgnd, M, Lon, Loff, Ldegen_on and Ldegen_off inductances for a third case with a negative coupling coefficient of −0.6 between inductors 552 and 554.

As shown in Table 2, a progressively more negative mutual inductance M may be obtained with a progressive more negative coupling coefficient. This results in progressively smaller Lon and Ldegen_on inductances for a progressive more negative coupling coefficient. A negative coupling coefficient may be used to reduce the Lon inductance to account or compensate for the Lgnd inductance, so that a desired Ldegen_on inductance may be obtained in the presence of the Lgnd inductance.

TABLE 2

| | Negative Coupling Coefficient K | | |
|---|---|---|---|
| | K = 0 | K = −0.3 | K = −0.6 |
| L1 | 1.0 nH | 1.0 nH | 1.0 nH |
| L2 | 0.5 nH | 0.5 nH | 0.5 nH |
| Lgnd | 0.5 nH | 0.5 nH | 0.5 nH |
| M | 0 | −0.21 nH | −0.42 nH |
| Loff | 1.0 nH | 1.0 nH | 1.0 nH |
| Lon | 0.33 nH | 0.21 nH | 0.07 nH |
| Ldegen_off | 1.5 nH | 1.5 nH | 1.5 nH |
| Ldegen_on | 0.83 nH | 0.71 nH | 0.57 nH |

Source degeneration inductors for an LNA may be implemented in various manners. Multiple inductors may have a particular coupling coefficient, which may be selected to obtain the desired Lon and Loff source degeneration inductances. The magnitude and sign of the coupling coefficient may be dependent on the layout and orientation of the inductors.

Figure 6:
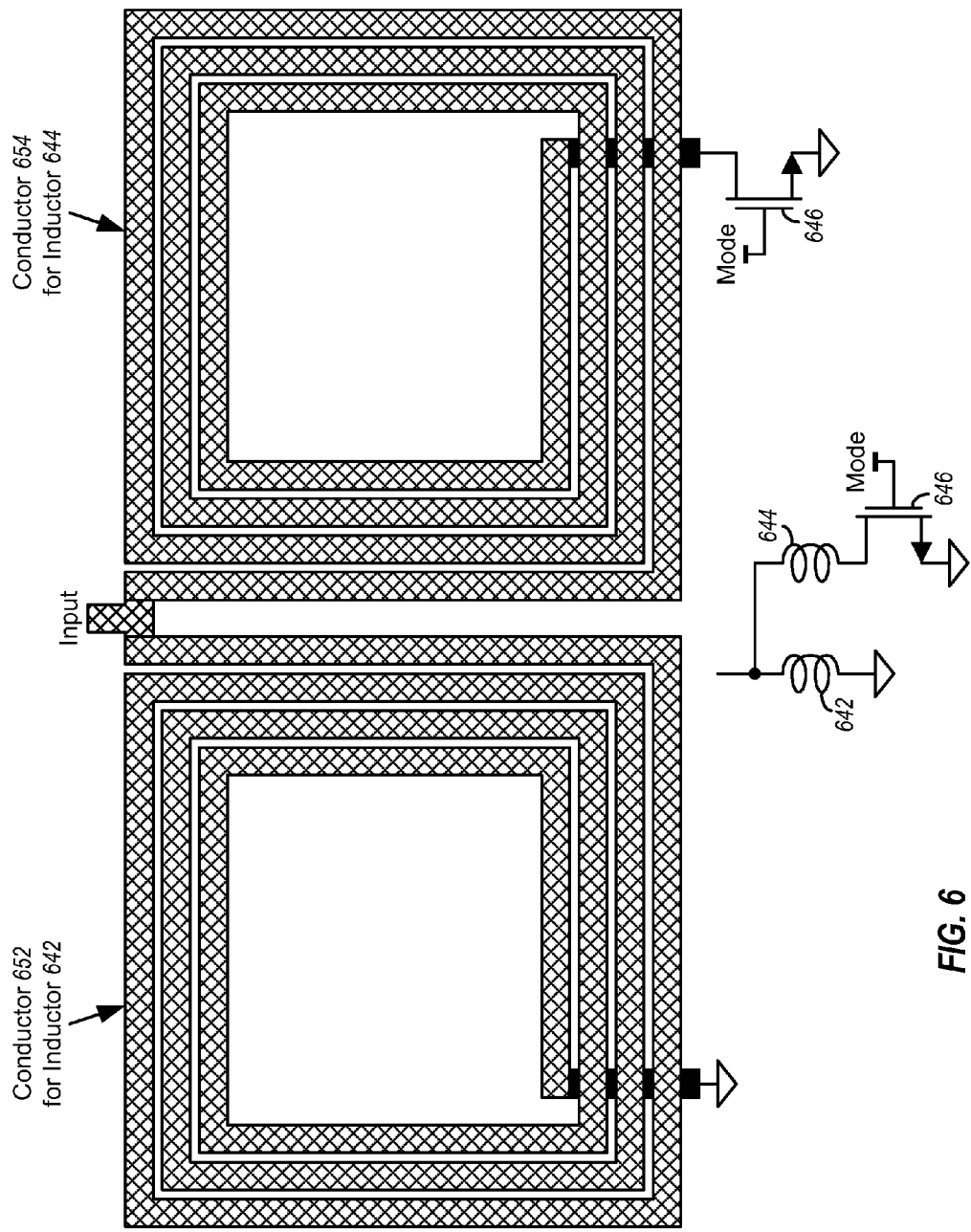
FIG. 6 shows two source degeneration inductors with little mutual coupling.

FIG. 6 shows an exemplary design of two source degeneration inductors 642 and 644 with little mutual coupling. Inductor 642 is implemented with a conductor 652, and inductor 644 is implemented with a conductor 654. Conductors 652 and 654 are formed side-by-side on the same metal layer and have one end coupled together and to the source of a gain transistor (not shown in FIG. 6). The other end of conductor 652 is coupled to circuit ground. The other end of conductor 654 is coupled to a transistor 646, which operates as a switch. The exemplary design in FIG. 6 utilizes twice the circuit area to implement inductors 642 and 644.

Figure 7:
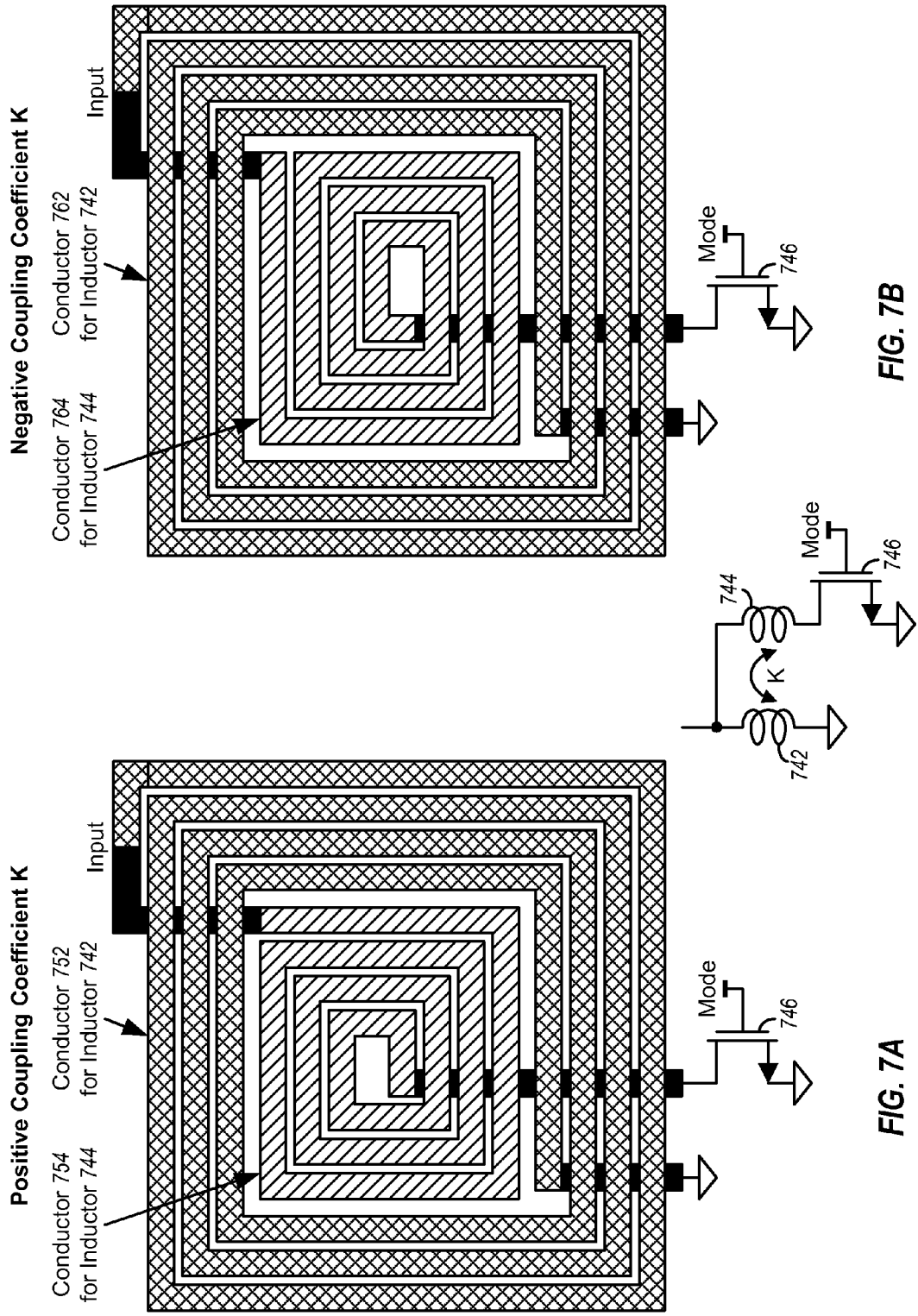
FIGS. 7A and 7B show two mutually-coupled source degeneration inductors with positive and negative coupling coefficients, respectively.

FIG. 7A shows an exemplary design of two mutually-coupled source degeneration inductors 742 and 744 with a positive coupling coefficient K. Inductor 742 is implemented with a conductor 752, and inductor 744 is implemented with a conductor 754. Conductor 754 is formed inside of conductor 752. Conductors 752 and 754 are formed in the same direction (which is clockwise in FIG. 7A) to obtain a positive K. Conductors 752 and 754 may be formed on the same metal layer (e.g., as shown in FIG. 7A) or on different metal layers.

FIG. 7B shows an exemplary design of two mutually-coupled source degeneration inductors 742 and 744 with a negative coupling coefficient K. Inductor 742 is implemented with a conductor 762, and inductor 744 is implemented with a conductor 764. Conductors 762 and 764 are formed in opposite direction to obtain a negative K. Conductors 762 and 764 may be formed on the same metal layer (e.g., as shown in FIG. 7B) or on different metal layers.

FIGS. 7A and 7B show exemplary layouts of mutually-coupled inductors. The mutually-coupled inductors may be implemented in other manners. For example, mutually-coupled inductors may be implemented on different metal layers.

Wireless device 110 may support operation on multiple frequency bands (or simply, "bands"). Each band may cover a range of frequencies. For example, LTE Release 11 defines 35 bands, which are referred to as LTE/UMTS bands and are listed in a publicly available document 3GPP TS 36.101. Wireless device 110 may support one or more LTE/UMTS bands and/or other bands.

Wireless device 110 may support carrier aggregation, which is operation on multiple carriers. Carrier aggregation may also be referred to as multi-carrier operation. A carrier may refer to a range of frequencies used for communication and may be associated with certain characteristics. For example, a carrier may be associated with system information and/or control information describing operation on the carrier. A carrier may also be referred to as a component carrier (CC), a frequency channel, a cell, etc. A band may include one or more carriers. Each carrier may cover up to 20 MHz in LTE. Wireless device 110 may be configured with up to 5 carriers in one or two bands in LTE Release 11.

Wireless device 110 may concurrently receive multiple transmitted signals at different frequencies. These multiple transmitted signals may be sent by one or more base stations on multiple carriers at different frequencies for carrier aggregation. These multiple transmitted signals may also be sent by different base stations for coordinated multi-point (CoMP) transmission, handover, etc. These multiple transmitted signals may also be sent by base stations in different wireless systems for concurrent services such as voice/data, or data/data, or voice/voice, etc. For example, wireless device 110 may support dual SIM/dual standby (DSDS) and/or dual SIM/dual-active (DSDA) and may be able to concurrently communicate with multiple wireless systems such as LTE and GSM systems, or TD-SCDMA and GSM systems, or CDMA and GSM systems, etc.

Figure 8:
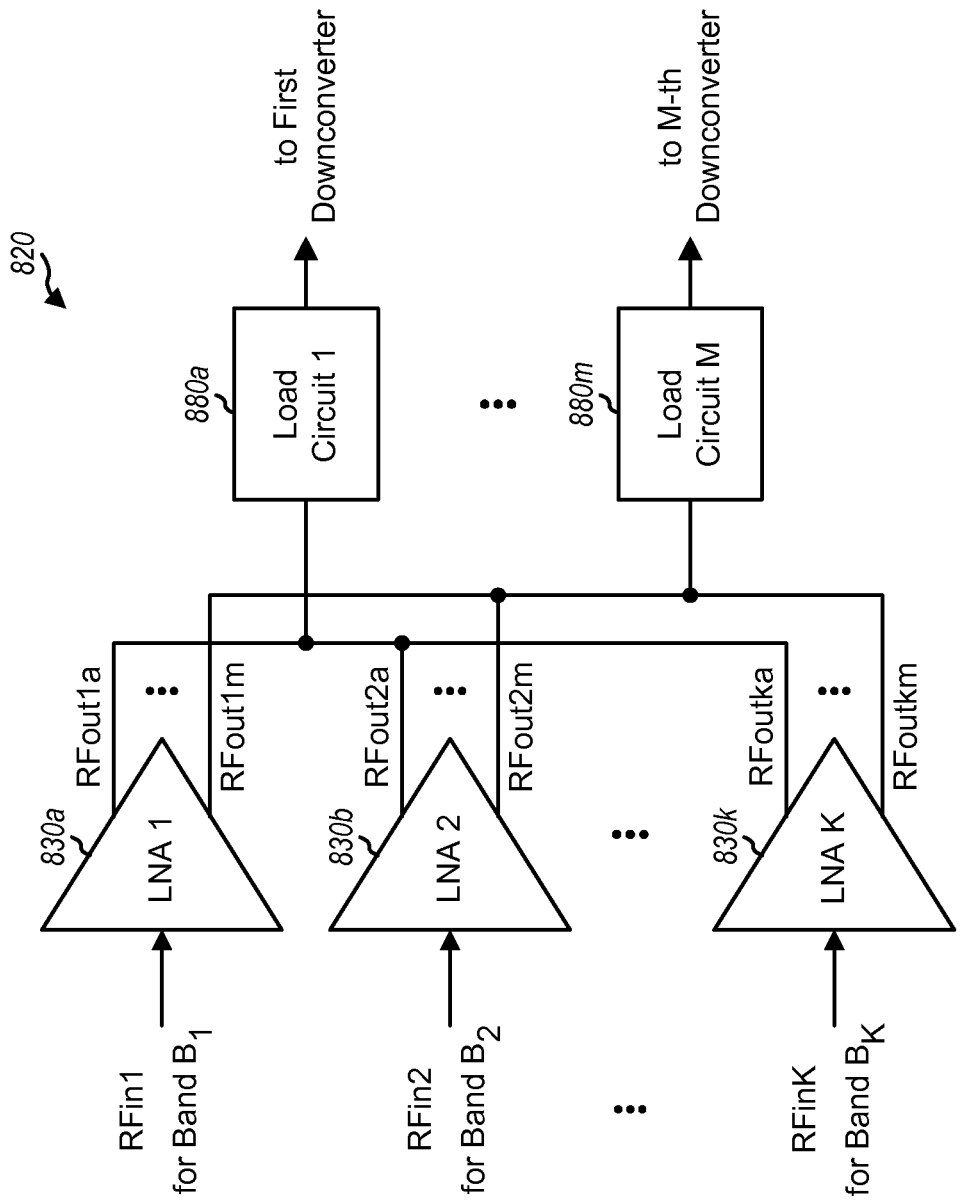
FIG. 8 shows a portion of a receiver supporting carrier aggregation.

FIG. 8 shows a block diagram of an exemplary design of a portion of a receiver 820 supporting carrier aggregation on multiple bands. Receiver 820 includes multiple (K) LNAs 830a to 830k and multiple (M) load circuits 880a to 880m, where K and M may each be any integer greater than one. The K LNAs 830a to 830k may support K bands $B_1$ to $B_K$, respectively, and may receive K input RF signals RFin1 to RFinK, respectively, for the K bands. Each LNA 830 may receive an input RF signal for a specific band and may have up to M outputs coupled to up to M load circuits 880a to 880m. Each load circuit 880 may have its input coupled to one output of each LNA 830 and its output coupled to a respective downconverter (not shown in FIG. 8). The M load circuits 880a to 880m may be coupled to M downconverters, which may be used to concurrently receive downlink signals sent on M sets of carriers, e.g., for carrier aggregation.

In general, any number of LNAs may be used to support any number of bands. Each LNA may include one or more inputs for one or more bands and one or more outputs coupled to one or more load circuits. The LNAs may have (i) the same or different numbers of inputs and (ii) the same or different numbers of outputs. The LNAs may be coupled to any number of load circuits.

Figure 9A:
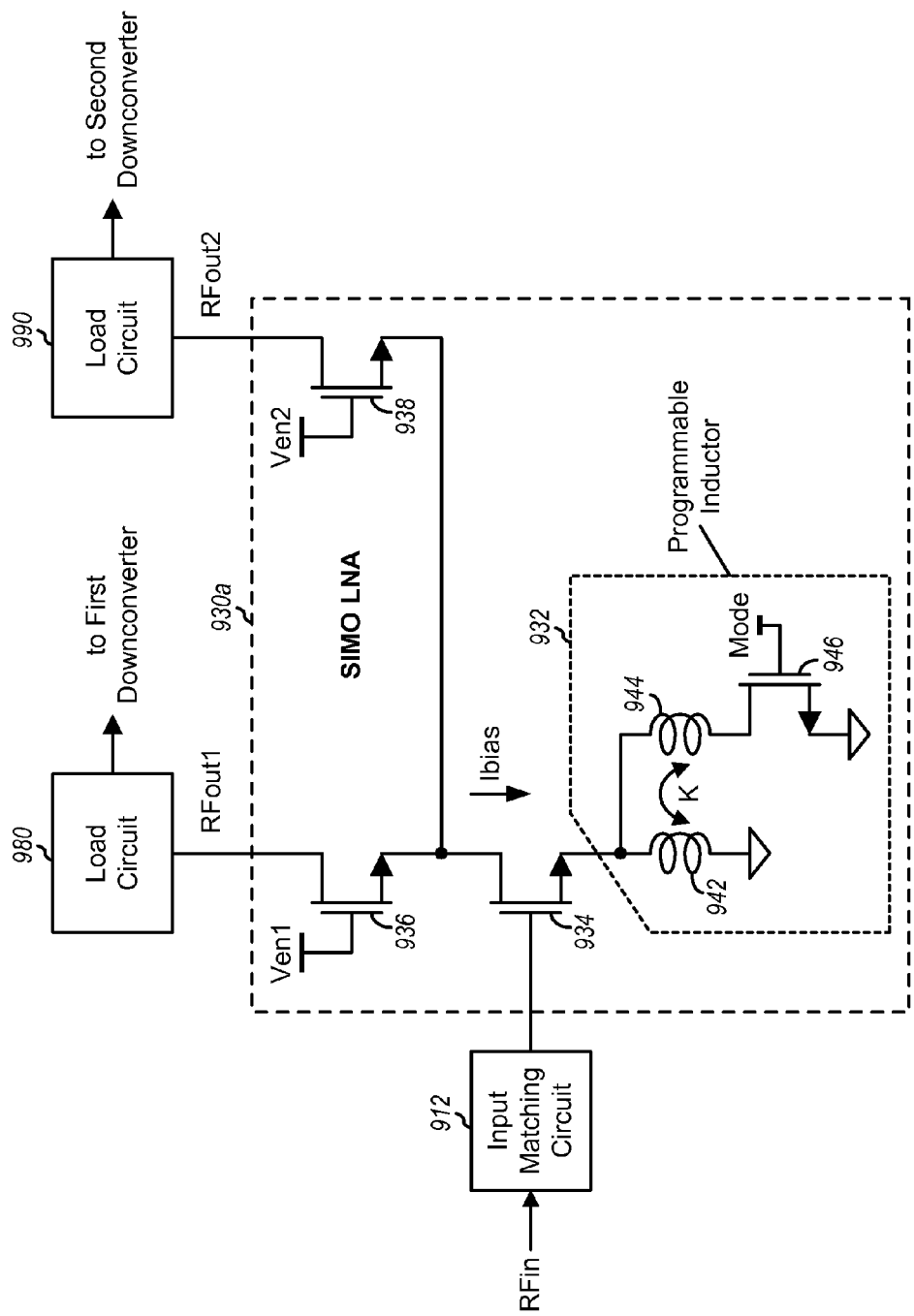
FIGS. 9A to 9D show LNAs with multiple outputs and configurable mutually-coupled source degeneration inductors.

FIG. 9A shows a schematic diagram of an exemplary design of a single-input multiple-output (SIMO) LNA 930a with configurable mutually-coupled source degeneration inductors. LNA 930a may be used for any of LNAs 230 and 232 in FIG. 2 or any of LNAs 830 in FIG. 8. In the exemplary design shown in FIG. 9A, LNA 930a includes a programmable inductor 932, a gain transistor 934, and two cascode transistors 936 and 938. An input matching circuit 912 has one end receiving an input RF signal (RFin) and the other end coupled to the gate of gain transistor 934. Gain transistor 934 has its source coupled to one end of inductor 932 and its drain coupled to the sources of cascode transistors 936 and 938. Inductor 932 is further coupled to circuit ground. Cascode transistor 936 has its gate receiving a first control signal (Ven1) and its drain coupled to a load circuit 980. Cascode transistor 938 has its gate receiving a second control signal (Ven2) and its drain coupled to a load circuit 990. Gain transistor 934 and cascode transistors 936 and 938 may be implemented with NMOS transistors, as shown in FIG. 9A, or with transistors of other types.

In the exemplary design shown in FIG. 9A, programmable inductor 932 includes two configurable mutually-coupled source degeneration inductors 942 and 944 coupled in parallel. Inductor 942 is coupled between the source of gain transistor 934 and circuit ground. Inductor 944 is coupled in series with a transistor 946, and the series combination is coupled between the source of gain transistor 934 and circuit ground. Transistor 946 operates as a switch that may be closed or opened. Inductor 942 has an inductance of L1, and inductor 944 has an inductance of L2.

For simplicity, FIG. 9A shows SIMO LNA 930a including two cascode transistors 936 and 938 to provide up to two output RF signals to up to two load circuits 980 and 990, e.g., for up to two sets of carriers being received concurrently for carrier aggregation. In general, a SIMO LNA may include N cascode transistors coupled to N load circuits to provide up to N output RF signals, where N may be any integer value greater than one.

SIMO LNA 930a may operate in a single-output mode or a multi-output mode at any given moment. In the single-output mode, LNA 930a receives an input RF signal comprising at least one transmitted signal (e.g., on one set of carriers) and provides one output RF signal via one cascode transistor 936 or 938 to one downconverter circuit. In the multi-output mode, LNA 930a receives an input RF signal comprising at least two transmitted signals (e.g., on two sets of carriers) and provides two output RF signals via two cascode transistors 936 or 938 to two downconverter circuits (e.g., one output RF signal for each set of carriers). Each downconverter downconverts its output RF signal with a separate LO signal at the proper frequency.

In an exemplary design, gain transistor 934 may be applied (i) a nominal bias current of Ib1 (or Ibias=Ib1) in the single-output mode or (ii) a higher bias current of Ib2 (or Ibias=Ib2) in the multi-output mode, where Ib2>Ib1. The nominal bias current may be selected to obtain a desired dynamic range for LNA 930a in the single-output mode. The higher bias current may be selected to obtain a desired dynamic range for LNA 930a in the multi-output mode. For example, the higher bias current may be selected to obtain similar dynamic range for LNA 930a in the multi-output mode as in the single-output mode. The higher bias current may be twice the nominal bias current (e.g., Ib2=2*Ib1) or some other integer or non-integer multiple of the nominal bias current (e.g., Ib2=q*Ib1, where q>1).

Increasing (e.g., doubling) the bias current of gain transistor 934 would reduce the gain of LNA 930a in the multi-output mode. Furthermore, increasing the bias current may degrade input matching of LNA 930a in the multi-output mode. It may not be possible to input match LNA 930a with a single matching circuit component, e.g., an inductor.

The gain, dynamic range, and input matching of an LNA in the multi-output mode may be preserved by using a programmable source degeneration inductor. The gain of the LNA may be reduced in the multi-output mode due to the use of higher bias current to maintain the desired dynamic range. The source degeneration inductor may be reduced in the multi-output mode in order to boost the gain of the LNA. Reducing the source degeneration inductor may also improve input matching of the LNA in the multi-output mode.

In an exemplary design, LNA 930a may operate with (i) a nominal source degeneration inductance of Loff in the single-output mode or (ii) a smaller source degeneration inductance of Lon in the multi-output mode, where Lon<Loff. In the single-output mode, transistor 946 may be turned OFF via a low voltage on the Mode signal, only inductor 942 may be coupled between the source of gain transistor 934 and circuit ground, inductor 944 may be disconnected from circuit ground, and the nominal source degeneration inductance may be provided by only inductor 942. Inductor 942 may be designed to provide a desired source degeneration inductance of Loff in the single-output mode, where Loff may be given as shown in equation (1). In the multi-output mode, transistor 946 may be turned ON via a high voltage on the Mode signal, both inductors 942 and 944 may be coupled between the source of gain transistor 934 and circuit ground, and a smaller source degeneration inductance may be provided by the parallel combination of mutually-coupled inductors 942 and 944. Inductors 942 and 944 may be designed with the proper inductances and coupling coefficient to obtain a desired source degeneration inductance of Lon in the multi-output mode, where Lon may be given as shown in equation (2).

In an exemplary design, LNA 930a may support multiple gain settings in the single-output mode and/or the multi-output mode. For example, a high-gain setting and a low-gain setting may be supported in the multi-output mode. The high-gain setting may be used to obtain higher gain with a smaller source degeneration inductance, which may be obtained by turning ON transistor 946. The low-gain setting may be used to obtain a lower gain with a larger source degeneration inductance, which may be obtained by turning OFF transistor 946. Different gains may also be supported in each gain setting of each mode by varying the bias current of gain transistor 934.

Figure 9B:
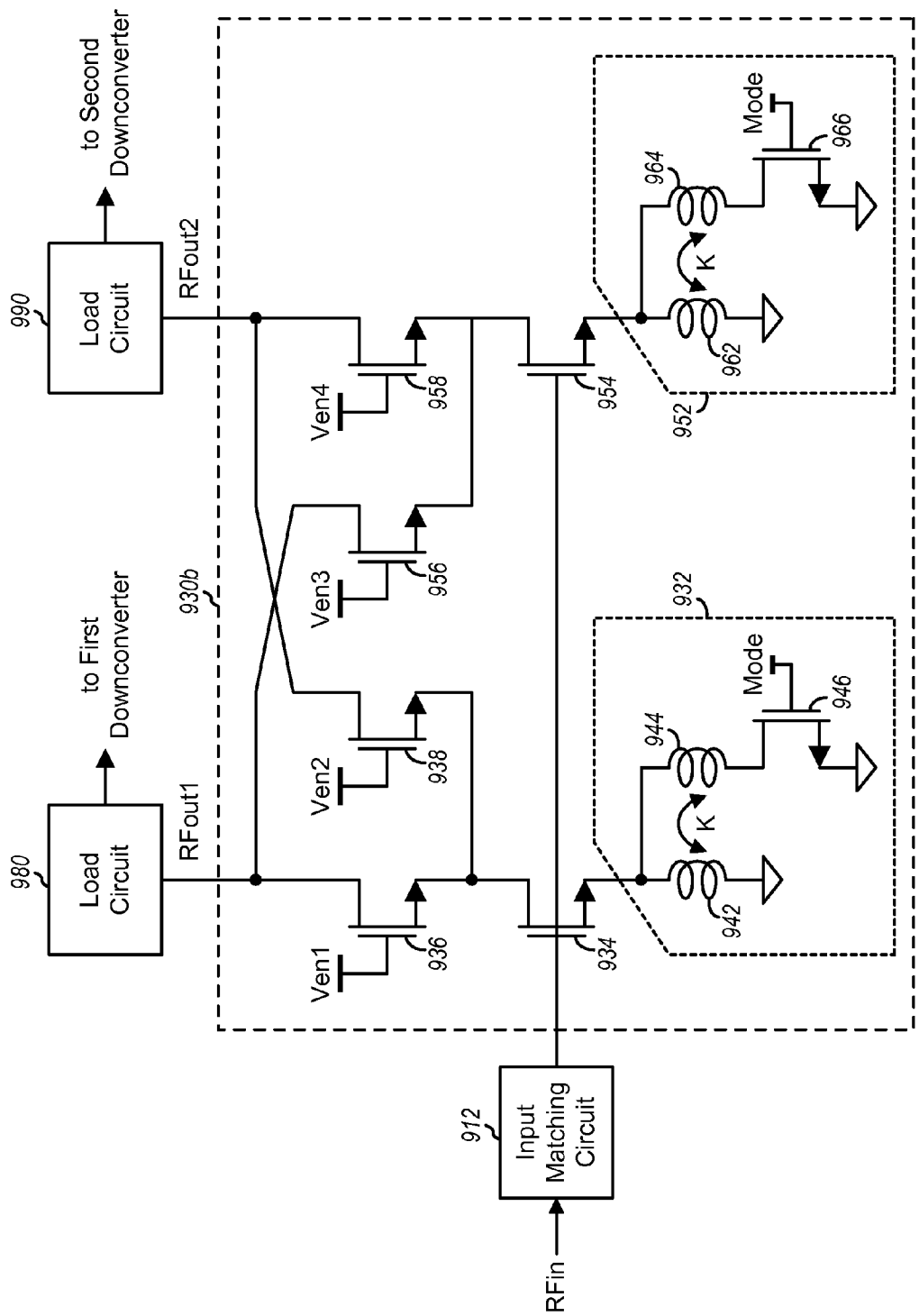

FIG. 9B shows a schematic diagram of an exemplary design of a SIMO LNA 930b with configurable mutually-coupled source degeneration inductors. LNA 930b may be used for any of LNAs 230 and 232 in FIG. 2 or any of LNAs 830 in FIG. 8. LNA 930b includes all of the circuit components in LNA 930a in FIG. 9A. LNA 930b further includes a second gain transistor 954, a second programmable inductor 952, and cascode transistors 956 and 958. Gain transistor 954 has its gate coupled to the output of input matching circuit 912, its source coupled to programmable inductor 952, and its drain coupled to the sources of cascode transistors 956 and 958. Programmable inductor 952 is further coupled to circuit ground. Cascode transistor 956 has its gate receiving a third control signal (Ven3) and its drain coupled to load circuit 980. Cascode transistor 958 has its gate receiving a fourth control signal (Ven4) and its drain coupled to load circuit 990.

In the exemplary design shown in FIG. 9B, programmable inductor 952 includes two configurable mutually-coupled source degeneration inductors 962 and 964 coupled in parallel. Inductor 962 is coupled between the source of gain transistor 954 and circuit ground. Inductor 964 is coupled in series with a transistor 966, and the series combination is coupled between the source of gain transistor 954 and circuit ground. Transistor 956 operates as a switch that may be closed or opened.

In the exemplary design shown in FIG. 9B, each gain transistor is coupled to a separate programmable inductor. In another exemplary design, one gain transistor (e.g., gain transistor 934) may be coupled to a programmable inductor, and the other gain transistor may be coupled to a fixed inductor. In yet another exemplary design, one gain transistor (e.g., gain transistor 934) may be coupled to a programmable inductor, and the other gain transistor may be coupled directly to circuit ground.

SIMO LNA 930b may operate in a single-output mode or a multi-output mode at any given moment. In one exemplary design of the single-output mode, both gain transistors 934 and 954 may be enabled, and two cascode transistors may be enabled. Cascode transistors 936 and 956 may be enabled to generate a first output RF signal (RFout1) for load circuit 980, and cascode transistors 938 and 958 may be disabled. Alternatively, cascode transistors 938 and 958 may be enabled to generate a second output RF signal (RFout2) for load circuit 990, and cascode transistors 936 and 956 may be disabled. In another exemplary design, one gain transistor 934 or 954 may be enabled, and one cascode transistor may be enabled. For both exemplary designs, one or both source degeneration inductors may be selected for each gain transistor that is enabled in order to obtain the desired dynamic range, gain, and input matching for LNA 930b in the single-output mode.

In the multi-output mode, both gain transistors 934 and 954 may be enabled. Cascode transistors 936 and 958 may be enabled to generate the RFout1 and RFout2 signals for load circuits 980 and 990, respectively, and cascode transistors 938 and 956 may be disabled. Alternatively, all four cascode transistors 936, 938, 956 and 958 may be enabled. One or both source degeneration inductors may be selected for each gain transistor in order to obtain the desired dynamic range, gain, and input matching for LNA 930b in the multi-output mode.

Figure 9C:
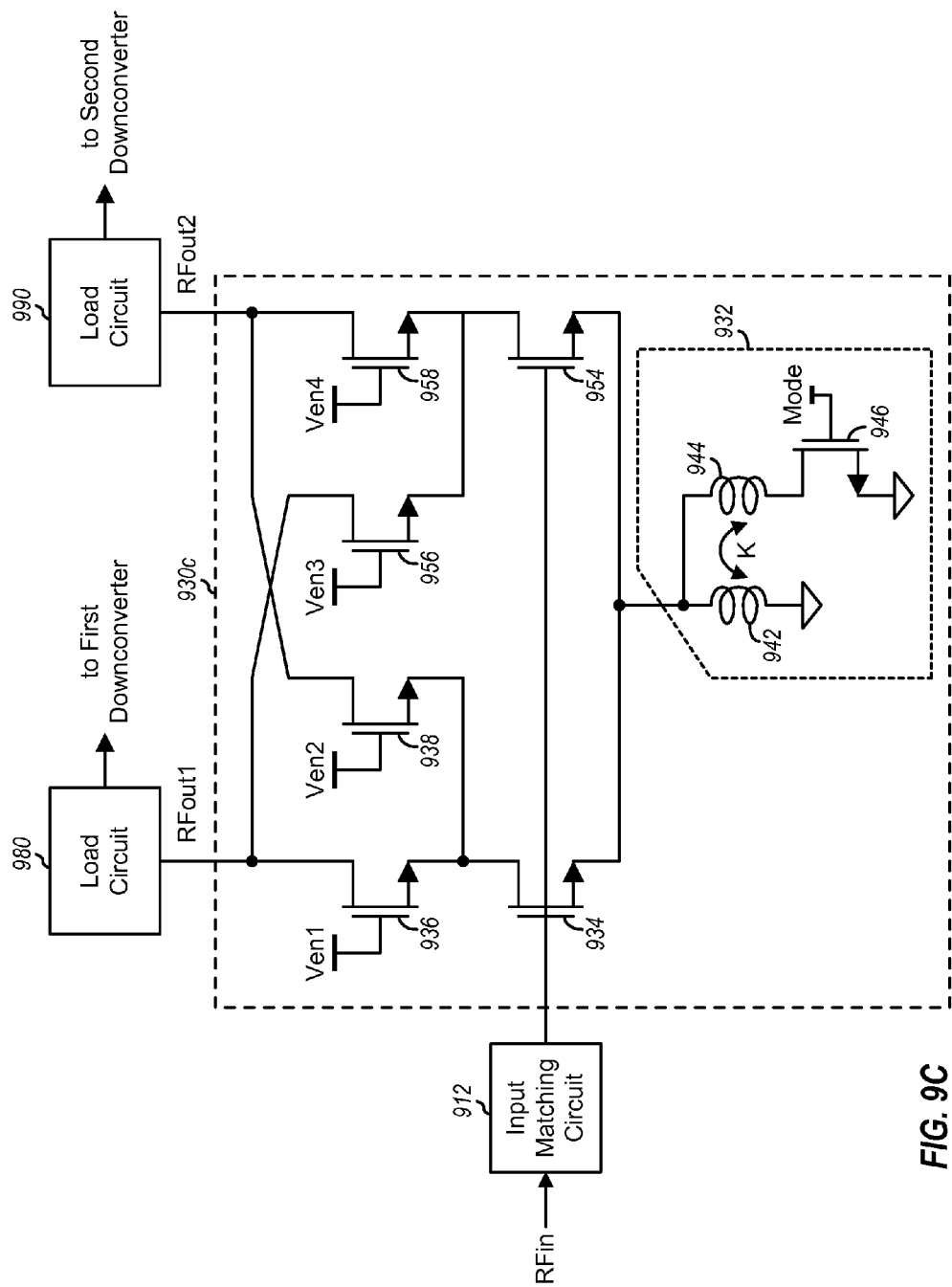

FIG. 9C shows a schematic diagram of an exemplary design of a SIMO LNA 930c with configurable mutually-coupled source degeneration inductors. LNA 930c may be used for any of LNAs 230 and 232 in FIG. 2 or any of LNAs 830 in FIG. 8. In the exemplary design shown in FIG. 9C, LNA 930c includes all of the circuit components in LNA 930b in FIG. 9B, except for programmable inductor 952, which is omitted from LNA 930c. Gain transistors 934 and 944 have their sources coupled together and to programmable inductor 932, which is further coupled to circuit ground.

SIMO LNA 930c may operate in a single-output mode or a multi-output mode at any given moment. One or more gain transistors and one or more cascode transistors may be enabled for each mode, as described above for FIG. 9B. In the single-output mode, only inductor 942 may be selected, and inductor 944 may be disconnected by turning OFF transistor 946. In the multi-output mode, both inductors 942 and 944 may be selected by turning ON transistor 946. Inductor 942 may be designed to provide the desired gain, dynamic range, and input matching for LNA 930c in the single-output mode. Inductors 942 and 944 may be designed to provide the desired gain, dynamic range, and input matching for LNA 930c in the multi-output mode.

Figure 9D:
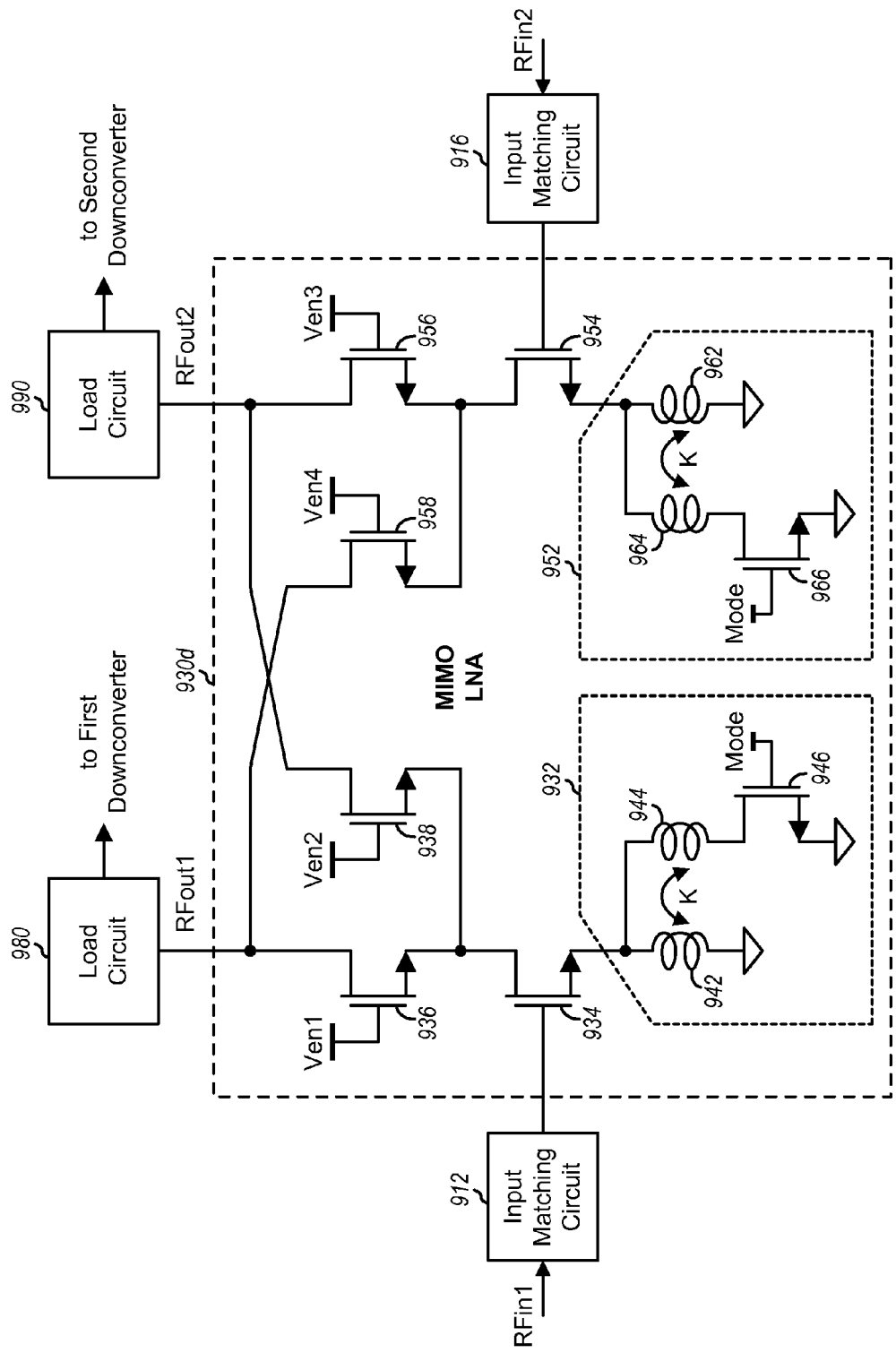

FIG. 9D shows a schematic diagram of an exemplary design of a MIMO LNA 930d with configurable mutually-coupled source degeneration inductors. LNA 930d may be used for any of LNAs 230 and 232 in FIG. 2 or any of LNAs 830 in FIG. 8. In the exemplary design shown in FIG. 9D, LNA 930d includes all of the circuit components in LNA 930b in FIG. 9B. However, gain transistors 934 and 954 are not coupled together as in LNA 930b. Instead, gain transistors 934 and 954 receive different input RF signals, e.g., for different bands. Gain transistor 934 has its gate coupled to input matching circuit 912, which receives a first input RF signal (RFin1). Input matching circuit 912 may perform input matching for LNA 930d for a first band. Gain transistor 954 has its gate coupled to an input matching circuit 916, which receives a second input RF signal (RFin2). Input matching circuit 916 may perform input matching for LNA 930d for a second band.

MIMO LNA 930d may operate in a single-output mode, a SIMO mode, or a MIMO mode at any given moment. In the single-output mode, one input RF signal (e.g., RFin1 or RFin2) may be amplified by one gain transistor (e.g., gain transistor 934 or 954) and buffered by one cascode transistor (e.g., cascode transistor 936, 938, 956 or 958) to obtain one output RF signal (e.g., RFout1 or RFout2) for one load circuit (e.g., load circuit 980 or 990). In the SIMO mode, one input RF signal (e.g., RFin1 or RFin2) may be amplified by one gain transistor (e.g., gain transistor 934 or 954) and buffered by two cascode transistors (e.g., cascode transistors 936 and 938 or cascode transistors 956 and 958) to obtain two output RF signals (e.g., RFout1 and RFout2) for two load circuits (e.g., load circuits 980 and 990). In the MIMO mode, two input RF signals (e.g., RFin1 and RFin2) may be amplified by two gain transistors (e.g., gain transistors 934 and 954) and buffered by two cascode transistor (e.g., cascode transistors 936 and 956 or cascode transistors 938 and 958) to obtain two output RF signals (e.g., RFout1 and RFout2) for two load circuits (e.g., load circuits 980 and 990).

Programmable inductors 932 and 952 may be operated to provide good performance in the single-output mode, the SIMO mode, and the MIMO mode. When gain transistor 934 is enabled in the single-output mode or the MIMO mode, programmable inductor 932 may be set (e.g., by turning OFF transistor 946) such that inductor 942 provides a nominal source degeneration inductance. When gain transistor 934 is enabled in the SIMO mode, programmable inductor 932 may be set (e.g., by turning ON transistor 946) such that inductors 942 and 944 provide a smaller source degeneration inductance. Similarly, when gain transistor 954 is enabled in the single-output mode or the MIMO mode, programmable inductor 952 may be set (e.g., by turning OFF transistor 966) such that inductor 962 provides a nominal source degeneration inductance. When gain transistor 954 is enabled in the SIMO mode, programmable inductor 952 may be set (e.g., by turning ON transistor 966) such that inductors 962 and 964 provide a smaller source degeneration inductance.

FIGS. 4, 5A-5B, and 9A-9D show some exemplary circuit designs of LNAs with configurable mutually-coupled source degeneration inductors. An LNA with configurable mutually-coupled source degeneration inductors may also be implemented in other manners. In another exemplary design, an LNA may include a feedback circuit coupled between an output and an input of the LNA. The feedback circuit may comprise a resistor, a capacitor, a transistor, some other circuit component, or a combination thereof. The feedback circuit may help with input matching and may also improve linearity of the LNA.

In another exemplary design, an LNA may include a cascode circuit in place of each cascode transistor. The cascode circuit may include (i) a first cascode transistor coupled between the drain of a gain transistor and an intermediate node, (ii) a second cascode transistor coupled between the intermediate node and an output of the LNA, and (iii) a shunt transistor coupled between the intermediate node and circuit ground. When the cascode circuit is enabled, the first and second cascode transistors may be turned ON to provide an output RF signal via the LNA output, and the shunt transistor may be turned OFF. When the cascode circuit is disabled, the first and second cascode transistors may be turned OFF to provide no output RF signal at the LNA output, and the shunt transistor may be turned ON to pull the intermediate node to circuit ground and provide better isolation between the LNA output and the gain transistor. Better isolation may be especially desirable when the same load circuit is reused by multiple gain transistors for different LNAs.

Amplifiers with configurable mutually-coupled source degeneration inductors, as disclosed herein, may provide various advantages. First, these amplifiers may support multiple operating modes such as, e.g., a single-output mode and a multi-output mode for carrier aggregation. The amplifiers may also provide good performance (e.g., good dynamic range, gain, input matching, etc.) for all supported operating modes. Second, the amplifiers may support multiple gain states such as, e.g., a low-gain state and a high-gain state. Different gain states may be applicable for different operating scenarios. For example, the low-gain state may be selected to improve linearity when jammers are present in an input RF signal. Third, the mutually-coupled inductors may be efficiently implemented in a smaller circuit area, e.g., as shown in FIGS. 7A and 7B. There may be other advantages to the amplifiers disclosed herein.

In an exemplary design, an apparatus (e.g., a wireless device, an IC, a circuit module, etc.) may include a gain transistor and a plurality of inductors, which may implement an amplifier or some other circuit. The gain transistor (e.g., gain transistor 434 in FIG. 4) may receive an input signal and provide an amplified signal. The plurality of inductors (e.g., inductors 442 and 444) may be mutually coupled, may be coupled to the gain transistor, and may provide a programmable source degeneration inductance for the gain transistor.

In an exemplary design, the plurality of inductors may include first and second inductors. The first inductor (e.g., inductor 442) may be coupled between the source of the gain transistor and circuit ground. The second inductor (e.g., inductor 444) may be coupled in series with a switch (e.g., transistor 446) and between the source of the gain transistor and circuit ground. In an exemplary design, the first and second inductors may have a positive coupling coefficient and, when the switch is closed, may provide a source degeneration inductance (Lon) that is larger than the parallel combination of the first and second inductors. In another exemplary design, the first and second inductors may have a negative coupling coefficient and, when the switch is closed, may provide a source degeneration inductance that is smaller than the parallel combination of the first and second inductors. In an exemplary design, an inductor (e.g., inductor 558 in FIG. 5B) may be coupled between the plurality of inductors and circuit ground. This inductor may be a parasitic inductor. The negative coupling coefficient may reduce the source degeneration inductance observed by the gain transistor when the switch is closed.

In an exemplary design, the first inductor may be formed by a first conductor (e.g., conductor 752 in FIG. 7A or conductor 762 in FIG. 7B) having a first spiral pattern. The second inductor may be formed by a second conductor (e.g., conductor 754 in FIG. 7A or conductor 764 in FIG. 7B) having a second spiral pattern. The second conductor may be located within the first spiral pattern of the first conductor, e.g., as shown in FIGS. 7A and 7B. The first and second spiral patterns may be formed in same direction to obtain a positive coupling coefficient for the first and second inductors, e.g., as shown in FIG. 7A. Alternatively, the first and second spiral patterns may be formed in opposite direction to obtain a negative coupling coefficient for the first and second inductors, e.g., as shown in FIG. 7B.

In an exemplary design, the apparatus may further include first and second cascode transistors, e.g., for a SIMO LNA. The first cascode transistor (e.g., cascode transistor 936 in FIG. 9A) may be coupled to the gain transistor and, when enabled, may receive the amplified signal and provide a first output signal. The second cascode transistor (e.g., cascode transistor 938) may be coupled to the gain transistor and, when enabled, may receive the amplified signal and provide a second output signal. Either the first or second cascode transistor may be enabled in a first operating mode, e.g., a single-output mode. The first and second cascode transistors may both be enabled in a second operating mode, e.g., a multi-output mode. The plurality of inductors may provide a first source degeneration inductance in the first operating mode or a second source degeneration inductance in the second operating mode. The second source degeneration inductance may be less than the first source degeneration inductance.

In an exemplary design, the apparatus may further include a second gain transistor, third and fourth cascode transistors, and a second plurality of inductors, e.g., for a SIMO LNA or a MIMO LNA. The second gain transistor (e.g., gain transistor 954 in FIG. 9B or 9D) may receive the input signal (e.g., for a SIMO LNA) or a second input signal (e.g., for a MIMO LNA) and may provide a second amplified signal. The second plurality of inductors (e.g., inductors 962 and 964 in FIG. 9B or 9D) may be mutually coupled, may be coupled to the second gain transistor, and may provide a programmable source degeneration inductance for the second gain transistor. The third cascode transistor (e.g., cascode transistor 956 in FIG. 9B or 9D) may be coupled to the second gain transistor and, when enabled, may receive the second amplified signal and provide the first output signal. The fourth cascode transistor (e.g., cascode transistor 958) may be coupled to the second gain transistor and, when enabled, may receive the second amplified signal and provide the second output signal.

Figure 10:
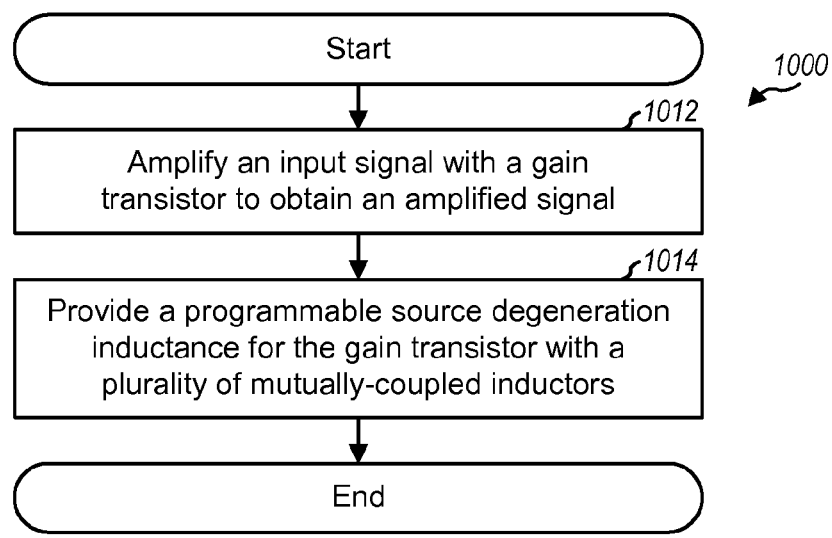
FIG. 10 shows a process for performing amplification.

FIG. 10 shows an exemplary design of a process 1000 for performing amplification. An input signal may be amplified with a gain transistor to obtain an amplified signal (block 1012). A programmable source degeneration inductance may be provided for the gain transistor with a plurality of mutually-coupled inductors (block 1014). The plurality of mutually-coupled inductors may include first and second inductors. In an exemplary design of block 1014, a first source degeneration inductance may be provided for the gain transistor based on the first inductor. A second source degeneration inductance may be provided for the gain transistor based on a parallel combination of the first and second inductors.

The first and second inductors may have a positive coupling coefficient, and the second source degeneration inductance may be larger than the parallel combination of the first and second inductors. Alternatively, the first and second inductors may have a negative coupling coefficient, and the second source degeneration inductance may be smaller than the parallel combination of the first and second inductors.

The amplifiers with configurable mutually-coupled source degeneration inductors described herein may be implemented on an IC, an analog IC, an RFIC, a mixed-signal IC, an ASIC, a printed circuit board (PCB), an electronic device, etc. The amplifiers may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a gain transistor configured to receive an input signal and provide an amplified signal; and
   a plurality of inductors coupled to the gain transistor and configured to provide a programmable source degeneration inductance for the gain transistor, the plurality of inductors being mutually coupled and including a first inductor coupled between a source of the gain transistor and circuit ground and a second inductor coupled in series with a switch and between the source of the gain transistor and circuit ground.

2. The apparatus of claim 1, the first and second inductors having a positive coupling coefficient.

3. The apparatus of claim 1, the first and second inductors having a negative coupling coefficient.

4. The apparatus of claim 3, further comprising:
   an inductor coupled between the plurality of inductors and circuit ground, the negative coupling coefficient reducing source degeneration inductance observed by the gain transistor when the switch is closed.

5. The apparatus of claim 1, the first inductor being formed by a first conductor having a first spiral pattern, and the second inductor being formed by a second conductor having a second spiral pattern.

6. The apparatus of claim 5, the first and second spiral patterns being formed in same direction to obtain a positive coupling coefficient for the first and second inductors.

7. The apparatus of claim 5, the first and second spiral patterns being formed in opposite direction to obtain a negative coupling coefficient for the first and second inductors.

8. The apparatus of claim 1, the second inductor being formed inside the first inductor.

9. The apparatus of claim 1, further comprising:
   a first cascode transistor coupled to the gain transistor and configured to receive the amplified signal and provide a first output signal when the first cascode transistor is enabled; and
   a second cascode transistor coupled to the gain transistor and configured to receive the amplified signal and provide a second output signal when the second cascode transistor is enabled.

10. The apparatus of claim 9, one of the first and second cascode transistors being enabled in a first operating mode, and both of the first and second cascode transistors being enabled in a second operating mode.

11. The apparatus of claim 10, the plurality of inductors are configurable to provide a first source degeneration inductance in the first operating mode or a second source degeneration inductance in the second operating mode.

12. The apparatus of claim 11, the second source degeneration inductance being less than the first source degeneration inductance.

13. The apparatus of claim 9, further comprising:
   a second gain transistor configured to receive the input signal or a second input signal and provide a second amplified signal;
   a second plurality of inductors coupled to the second gain transistor and configured to provide a programmable source degeneration inductance for the second gain transistor, the second plurality of inductors being mutually coupled;
   a third cascode transistor coupled to the second gain transistor and configured to receive the second amplified signal and provide the first output signal when the third cascode transistor is enabled; and a fourth cascode transistor coupled to the second gain transistor and configured to receive the second amplified signal and provide the second output signal when the fourth cascode transistor is enabled.

14. A method comprising:

amplifying an input signal with a gain transistor to obtain an amplified signal; and providing a programmable source degeneration inductance for the gain transistor by providing a first source degeneration inductance for the gain transistor based on a first inductor and providing a second source degeneration inductance for the gain transistor based on a parallel combination of the first inductor and a second inductor mutually coupled with the first inductor;

wherein the first and second inductors have a positive coupling coefficient, and the second source degeneration inductance is larger than a parallel combination of the first and second inductors.

15. A method comprising:

amplifying an input signal with a gain transistor to obtain an amplified signal; and providing a programmable source degeneration inductance for the gain transistor by providing a first source degeneration inductance for the gain transistor based on a first inductor and providing a second source degeneration inductance for the gain transistor based on a parallel combination of the first inductor and a second inductor mutually coupled with the first inductor;

wherein the first and second inductors have a negative coupling coefficient, and the second source degeneration inductance is smaller than a parallel combination of the first and second inductors.

\* \* \* \* \*